US005548552A

United States Patent [19]
Madurawe

[11] Patent Number: 5,548,552
[45] Date of Patent: Aug. 20, 1996

[54] RECONFIGURABLE PROGRAMMABLE LOGIC DEVICE

[75] Inventor: Raminda Madurawe, Sunnyvale, Calif.

[73] Assignee: Altera Corporation, San Jose, Calif.

[21] Appl. No.: 457,884

[22] Filed: May 31, 1995

Related U.S. Application Data

[62] Division of Ser. No. 314,012, Sep. 28, 1994.
[51] Int. Cl.[6] .................................................. G11C 11/34
[52] U.S. Cl. ........................................ 365/185.33; 326/38
[58] Field of Search .......................... 365/185.33, 174, 365/94, 96, 185.01; 326/38, 39, 47

[56] References Cited

U.S. PATENT DOCUMENTS

| | | | |
|---|---|---|---|
| 4,858,185 | 8/1989 | Kowshik et al. | 365/181 |
| 5,021,689 | 6/1991 | Pickett et al. | 365/189 |
| 5,105,388 | 4/1992 | Itano et al. | 326/38 |
| 5,121,359 | 6/1982 | Steele | 365/189 |
| 5,237,219 | 8/1993 | Cliff | 307/465 |
| 5,247,478 | 9/1993 | Gupta et al. | 365/185 |
| 5,272,368 | 12/1993 | Turner et al. | 257/315 |
| 5,336,950 | 8/1994 | Popli et al. | 326/39 |
| 5,353,248 | 10/1994 | Gupta | 365/154 |
| 5,394,031 | 2/1995 | Britton et al. | 326/38 |

OTHER PUBLICATIONS

"iFX740 10 ns FLEXlogic FPGA with SRAM Option," Intel Corporation product bulletin, Nov. 1993.

*Primary Examiner*—David C. Nelms
*Assistant Examiner*—F. Niranjan
*Attorney, Agent, or Firm*—Townsend and Townsend and Crew

[57] ABSTRACT

The present invention provides a reconfigurable programmable logic device (PLD) that saves its own programmed state without the use of an external memory device or without additional control logic on the PLD. A non-volatile memory cell is incorporated with each SRAM cell in the PLD to form a configuration memory cell. The non-volatile memory cells store the programmed states of the associated SRAM cells even after termination of power to the system. Each non-volatile memory cell then restores the configured state of its associated SRAM cell upon system power-up by "mapping" its contents to the SRAM cell. The non-volatile memory cell may be implemented either by an Erasable Programmable Read Only Memory cell ("EPROM") or an Electrically Erasable Programmable Read Only Memory cell ("EEPROM").

12 Claims, 4 Drawing Sheets

RECONFIGURABLE PROGRAMMABLE LOGIC DEVICE

This is a Division of application Ser. No. 08/314,012 filed Sep. 28, 1994.

BACKGROUND OF THE INVENTION

This invention relates to programmable logic, and in particular to a programmable logic device that can be reconfigured in whole or in part without the use of an external memory device.

A programmable logic device (PLD) is a programmable integrated circuit that allows the user of the circuit, using software control, to customize the logic functions the circuit will perform. The logic functions previously performed by small, medium and large scale integration integrated circuits can instead be performed by programmable logic devices. When a typical programmable logic device is supplied by an integrated circuit manufacturer, it is not yet capable of performing any specific function. The user, in conjunction with software supplied by the programmable logic device manufacturer, can program the PLD to perform the specific function or functions required by the user's application. The PLD then can function in a larger system designed by the user, just as though dedicated logic chips were employed.

A typical PLD consists of an array of logic cells that can be individually programmed and arbitrarily interconnected to each other to provide internal input and output signals, thus permitting the performance of highly complex combinational and sequential logic functions. The program is implemented in the PLD by setting the states of programmable elements such as memory cells. These memory cells may be implemented with volatile memories, such as SRAMs, which lose their programmed states upon termination of power to the system, or with non-volatile memories, such as EPROMs or EEPROMs, which retain their contents upon termination of power. If the programmable elements used are volatile memories, the memory cells must be reconfigured upon system power-up in order to restore the PLD to the desired programmed state. The reconfiguration step is achieved by saving the configured states in an external non-volatile memory device that will save the PLD configuration even after power-down. Then, when power is restored to the system, the configured states of the memory cells are serially loaded from the non-volatile external memory device to the PLD.

This method of PLD reconfiguration forces the system designer to include additional control logic dedicated to serial loading of configuration data from the external memory device every time the system is powered up. Furthermore, each time the configuration of the PLD is altered, a new external non-volatile memory device must be inserted into the system, making system design changes cumbersome and increasing the expense of the system as more and more design changes are implemented.

Accordingly, it would be preferable to reconfigure the PLD upon power-up without resorting to the use of an external non-volatile memory device.

SUMMARY OF THE INVENTION

The present invention provides a reconfigurable programmable logic device in a single integrated circuit package that saves its own programmed state without the use of an external memory device. A non-volatile memory element and a volatile memory element (such as an SRAM cell) collectively form a configuration memory cell on a single die in the PLD. Each non-volatile memory cell is associated with one volatile memory cell and stores the programmed state of the associated volatile memory cell even after termination of power to the system. Each non-volatile memory cell then automatically restores the configured state of its associated volatile cell upon system power-up.

The non-volatile memory element may be implemented by an Erasable Programmable Read Only Memory cell ("EPROM") or an Electrically Erasable Programmable Read Only Memory cell ("EEPROM"). The incorporation of non-volatile memory in the PLD die itself eliminates the need to use an external memory device for storing the configured PLD states.

A further understanding of the nature and advantages of the inventions herein may be realized by reference to the remaining portions of the specification and the attached drawings.

DESCRIPTION OF THE PREFERRED EMBODIMENTS

Figure 1:
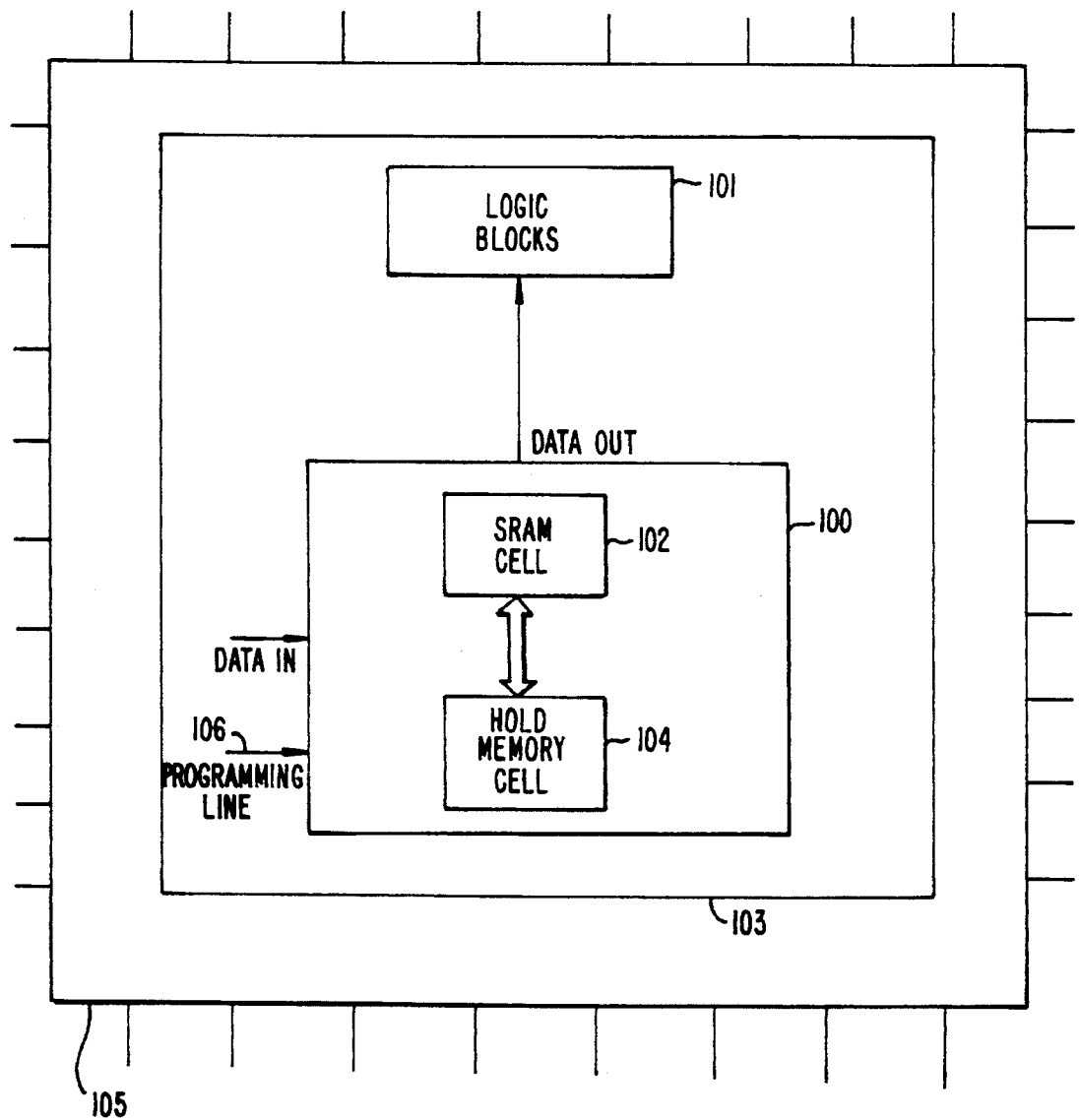
FIG. 1 is a block diagram of a PLD with a representative configuration memory cell according to the present invention.

The block diagram of FIG. 1 illustrates the concept of the present invention. FIG. 1 shows an SRAM bit and a non-volatile memory bit which collectively form a representative configuration memory cell 100. The cell 100 includes SRAM memory cell 102, hold memory cell 104, and programming line 106. Configuration memory cell 100 has data-in and data-out terminals that are used to write data in and read data out of the SRAM cell 102 and hold memory cell 104. The hold memory cell 104 is a non-volatile memory cell which retains its contents even when power is disconnected. Hold memory cell 104 can, for example, be an Electrically Erasable Programmable Read Only Memory ("EEPROM"), an Erasable Programmable Read Only Memory ("EPROM") or a ROM bit such as an electrically programmed fuse.

The configuration memory cell 100 is one of many cells that configures logic blocks 101. The logic blocks 101, SRAM cells 102 and hold memory cells 104 are preferably formed on a single die 103 in an integrated circuit package 105. It will be recognized that while a preferred embodiment of the invention provides for both types of memory cells to be formed as one latch on a single die, in some embodiments both types of memory cells will be in a single integrated circuit package 105 on multiple dies 103.

In operation, the user programs the SRAM cell 102 to configure the PLD in a desired state. As long as power is connected to the system, SRAM cell 102 retains its contents and is used in the logic applications of the PLD. However, unless the contents of SRAM cell 102 are stored in another memory cell, the configured state of the PLD is lost upon termination of power to the system. Therefore, prior to system power-down, a programming signal is transmitted on programming line 106 that causes the contents of SRAM cell 102 to be "mapped" to hold memory cell 104. Optimally, the contents of SRAM cell 102 are continuously stored in hold memory cell 104.

Upon system power-up, the contents of hold memory cell 104 are automatically "mapped" into SRAM cell 102, reconfiguring the SRAM cell 102 to the desired state. The above method of reconfiguring SRAM cell 102 eliminates the need for an external serial memory. A more detailed description of several embodiments of the present invention is given below in conjunction with FIGS. 2, 3 and 4.

Figure 2:
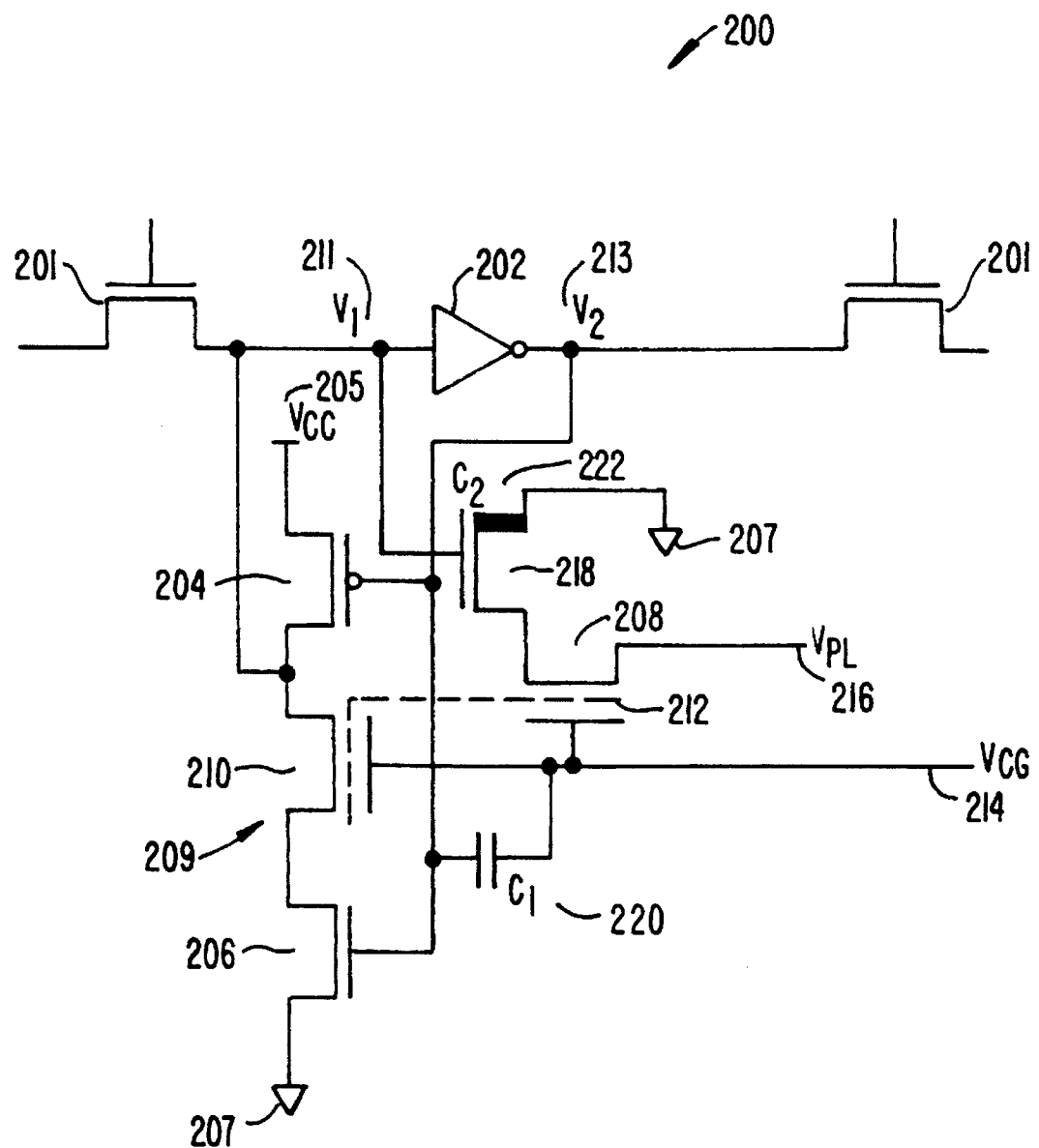
FIG. 2 is a schematic diagram of a representative configuration memory cell in a PLD where an EPROM is used to store configuration data.

FIG. 2 is a schematic diagram of a memory cell in a PLD where hold memory cell 104 (shown in FIG. 1) is implemented by an EPROM cell, which may be either a standard EPROM or a flash EPROM device. FIG. 2 shows a representative memory cell 200 in a PLD situated between pass transistors 201 that includes an SRAM cell and an EPROM hold memory cell 209, as outlined above. The SRAM cell includes a strong inverter 202 and a weak feedback inverter, which is the combination of PMOS transistor 204 and NMOS transistor 206. The output of strong inverter 202 is voltage $V_2$ 213 and is coupled to the input of the weak inverter at the gate of PMOS transistor 204 and the gate of NMOS transistor 206, while the output of the weak inverter at the drain of PMOS transistor 204 is coupled to the input of strong inverter 202, which is voltage $V_1$ 211. The source of PMOS transistor 204 is pulled up to power supply potential $V_{cc}$ 205 and the source of NMOS transistor is pulled down to ground potential 207.

EPROM hold memory cell 209 is a typical EPROM cell that can be erased by placing the device under an ultraviolet light source. The EPROM cell 209 is made up of a write transistor 208 and a read transistor 210 which share a floating gate 212. The drain of read transistor 210 is coupled to the drain of PMOS transistor 204, and the source of read transistor 210 is coupled to the drain of NMOS transistor 206. The gate of read transistor 210 is coupled to the gate of write transistor 208, and both gates are driven by a control gate voltage $V_{CG}$ 214, which is a global control line. The drain of write transistor is coupled to a programming line 216 that is driven by a programming voltage signal $V_{PL}$.

Another NMOS transistor 218 provides a current path to ground when the EPROM write transistor 208 is being programmed. The source of write transistor 208 is coupled to the drain of NMOS transistor 218, and the drain of transistor 218 is coupled to ground. The gate of transistor 218 is coupled to the input of strong inverter 202. Capacitor $C_1$ 220 is coupled between control gate 214 and the gate of NMOS transistor 206. Capacitor $C_2$ 222 couples the gate of transistor 218 to ground and may be formed as part of the transistor, as shown in the figure.

In operation, the EPROM cell is erased at initial system power-up. $V_{PL}$ is tied to a ground potential and $V_{CG}$ is set to 5 V, so the erased EPROM read transistor 210 is conducting and acts as a simple resistor between the PMOS and NMOS transistors 204, 206 in the weak inverter. The user may then program the latches 200 to operate the PLD in a desired fashion in a logic circuit. The configured states of the latches may be stored so that the PLD can be used on a repeated basis in the same system without having to reprogram all of the latches. To initiate programming, control gate voltage $V_{CG}$ 214 is set to a very high potential, such as 12.5 V, and programming line voltage $V_{PL}$ 216 is also set to a high potential, such as 6 V.

If the configuration to be stored is such that the input of strong inverter 202, signal $V_1$ 211, is a logic level LOW (0 V), the input to transistor 218 will be LOW and transistor 218 will not conduct. Thus, no current path is created from programming voltage line 216 through write transistor 208 to ground. Without any current flowing through write transistor 208, no charge can be stored on floating gate 212 and the EPROM cell remains erased. However, if signal $V_1$ is a logic HIGH, transistor 218 will conduct, forming a current path from $V_{PL}$ to ground. The current flowing through write transistor 208 will generate electrons attracted by the very high potential of 12.5 V on the control gate of transistor 208. The electrons are then captured by and stored in floating gate 212, according to the well-known principles of programming an EPROM cell, leaving the EPROM cell programmed. After the programming process is complete, the system power may be terminated and the logic state of each SRAM latch 200 is saved in its associated EPROM memory cell.

Upon subsequent power-up of the system, the state of each latch 200 will be restored to its previous state. As above, control gate voltage $V_{CG}$ 214 is set to 5 V and programming line voltage $V_{PL}$ 216 is set to 0 V.

If signal $V_1$ was previously LOW, the EPROM cell is erased since no charge was stored on floating gate 212. In that case, read transistor 210 of the EPROM cell is conducting because the control gate voltage $V_{CG}$ is sufficient to turn it ON. Additionally, $V_2$ is pulled to a HIGH logic level, since it is coupled through capacitor $C_1$ 220 to the high control gate voltage $V_{CG}$ of 5 V. The HIGH level of $V_2$ also turns NMOS transistor 206 ON and PMOS transistor 204 OFF. Thus, because both transistors 206 and 210 are conducting, voltage $V_1$, which is tied to the source of read transistor 210, is pulled down to ground. Furthermore, $V_1$ is coupled through capacitance $C_2$ 222 to ground anyway, which also tends to pull the voltage level at the input of strong inverter 202 to ground. Therefore, when the EPROM cell was erased, a LOW voltage level is restored to $V_1$ and a HIGH voltage level is restored to $V_2$, which conforms to the previously configured state of the PLD latch.

If signal $V_1$ was previously HIGH, the EPROM cell is programmed since charge was stored on floating gate 212, as outlined above. In that case, read transistor 210 is not conducting, since a control gate voltage $V_{CG}$ of 5 V is insufficient to turn read transistor 210 ON when the floating gate 212 is storing a charge. Because read transistor 210 is OFF, there is no current path to ground through the weak inverter. Consequently, the output of the weak inverter is coupled to the power supply potential $V_{cc}$ through PMOS transistor 204, which tends to drive voltage $V_1$ HIGH. Therefore, the output of strong inverter 202, voltage $V_2$, is LOW, and the previous state of the latch has been restored by the programmed EPROM cell.

Figure 3:
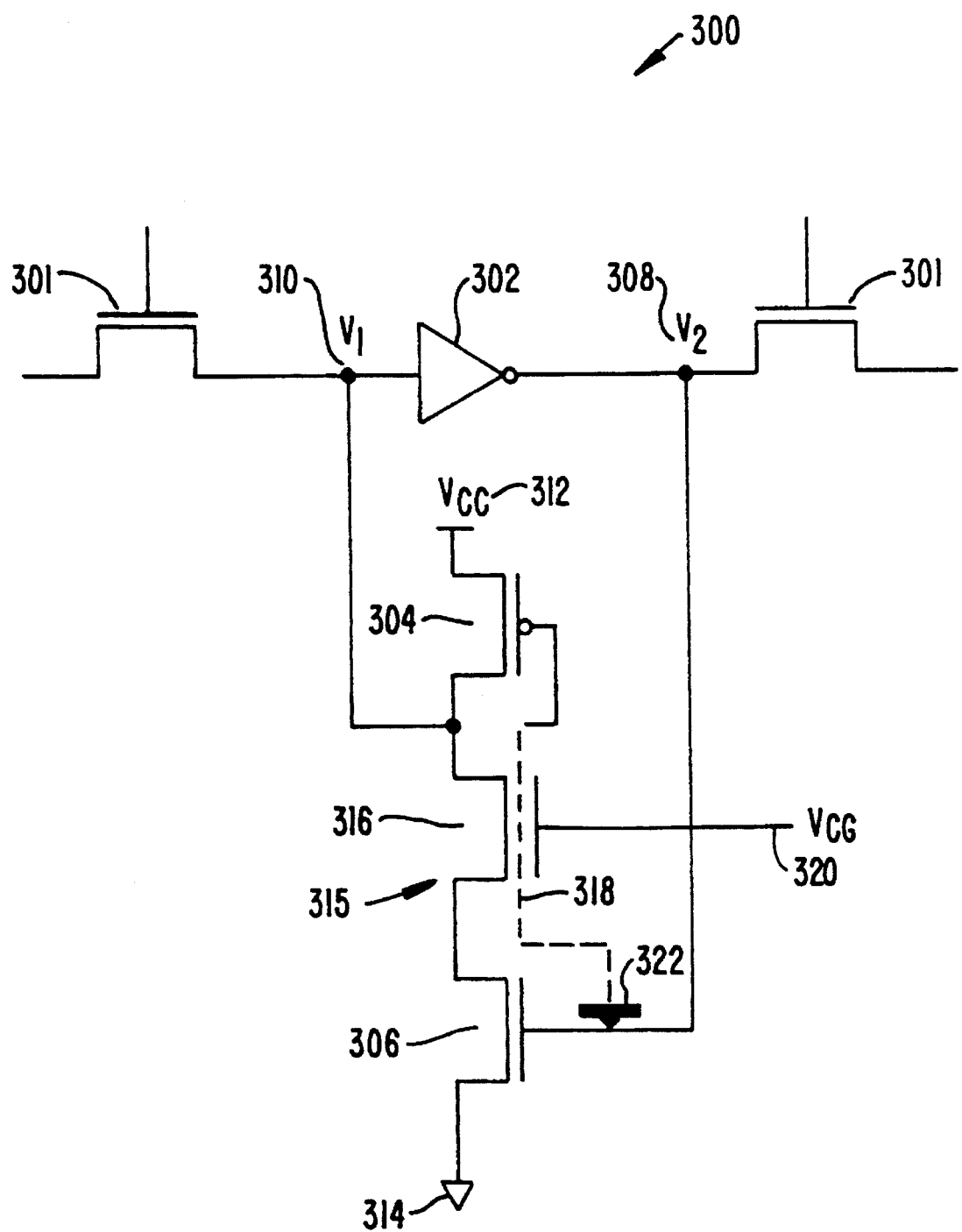
FIG. 3 is a schematic diagram of a representative configuration memory cell in a PLD where an EEPROM without electrically erasable capabilities is used to store configuration data.

FIG. 3 is a schematic diagram of a latch in a PLD where the hold memory cell is implemented by an EEPROM cell that lacks the capability to be electrically erased. The omission of the extra transistors which would facilitate electric erasure of the device creates a reconfigurable PLD memory cell with very low overhead when compared to a non-reconfigurable PLD memory cell.

FIG. 3 shows a representative memory cell 300 in a PLD situated between pass transistors 301 that includes an SRAM cell and an EEPROM hold memory cell 315. The structure of the SRAM cell in memory cell 300 is similar to that of memory cell 200 (shown in FIG. 2). The SRAM cell includes a strong inverter 302 and a weak feedback inverter, which is the combination of PMOS transistor 304 and NMOS transistor 306. The output of strong inverter 302 is voltage $V_2$ 308 and is coupled to the gate of NMOS transistor 306, while the output of the weak inverter at the drain of PMOS transistor 304 is coupled to the input of strong inverter 302, which is voltage $V_1$ 310. The source of PMOS transistor 204 is pulled up to power supply potential $V_{cc}$ 312 and the source of NMOS transistor 306 is pulled down to ground potential 314.

EEPROM hold memory cell 315 is an EEPROM cell that lacks the additional transistors that facilitate electronic erasure of the memory cell. Therefore, the embodiment of the present invention shown in FIG. 3 would be useful for a one-time use. However, the EEPROM cell could be erased by placing it under an ultraviolet light source, but this would necessitate providing a window on the device to allow exposure of the cells to the light source, much as a typical EPROM device. EEPROM hold memory cell 315 includes hold transistor 316 with a floating gate 318. The EEPROM cell is controlled at its gate by a control gate voltage $V_{CG}$ 320, which is a global control line. The drain of transistor 316 is coupled to the output of the weak inverter at the drain of PMOS transistor 304, while the source of hold transistor 316 is coupled to the drain of NMOS transistor 306. The floating gate 318 is coupled to the gate of PMOS transistor 304 and to a tunneling diode 322 that is coupled to the gate of NMOS transistor 306.

In operation, the EEPROM cell is erased at initial system power-up. $V_{CG}$ is set to 5 V, so the erased EEPROM hold transistor 316 is conducting and acts as a simple resistor between the PMOS and NMOS transistors 304, 306 in the weak inverter. If a PMOS transistor with an adjusted threshold voltage of −2 V is used in the system, PMOS transistor 304 will be OFF when $V_{CG}$ is set to 5 V. The user may then program the latches 300 to operate the PLD in a desired fashion in a logic circuit. When it comes time to power the system down, however, the states of the configured latches will need to be stored so that the PLD can again be used in the same system upon subsequent power-up without the user having to reprogram all of the latches. To initiate programming, control gate voltage $V_{CG}$ 320 is set to a very high potential, such as 14 V. Assuming a typical coupling ratio of 0.7 between the control gate and floating gate of an EEPROM device, the very high potential of 14 V at $V_{CG}$ creates a potential of approximately 9.8 V on floating gate 318.

If the configuration to be stored is such that the input of strong inverter 302, signal $V_1$ 310, is a logic level LOW, the signal $V_2$ 308, and the input to the gate of NMOS transistor 306, is a logic HIGH. Thus, given that the floating gate is already at a very high potential, there is an insufficient potential gradient across tunneling diode 322 between $V_2$ and the floating gate 318 to inject electrons on the floating gate 318, according to Fowler-Nordheim principles of programming an EEPROM cell. Therefore, the floating gate 318 will not receive any charge and the EEPROM cell will remain erased. On the other hand, if the configuration of the PLD latch to be stored is such that $V_1$ is HIGH, $V_2$ will then be at a logic LOW, creating a large potential gradient across tunneling diode 322 with respect to floating gate 318 that is sufficient to draw electrons on to the floating gate 318. This process leaves a negative potential of about −4 V on the floating gate, signifying that EEPROM hold transistor 316 is in a programmed state. After the programming process is complete, the system power may be terminated and the logic state of each SRAM latch 300 is saved in its associated EEPROM memory cell.

Upon subsequent power-up of the system, the state of each latch 300 will be restored to its previous state. As above, control gate voltage $V_{CG}$ 214 is set to 5 V.

If signal $V_1$ was previously LOW, the EEPROM cell was erased since no charge was stored on floating gate 318. In that case, hold transistor 316 of the EEPROM cell is conducting because the control gate voltage $V_{CG}$ is sufficient to turn it ON. Additionally, a control gate voltage $V_{CG}$ of 5 V, again given a coupling ratio of 0.7, induces a voltage of about 3.5 V on the floating gate 318. Recalling that floating gate 318 is coupled to the gate of PMOS transistor 304, an input voltage of 3.5 V to PMOS transistor 304 will leave PMOS transistor 304 OFF, since it has an adjusted threshold voltage of −2 V. But NMOS transistor 306 is gradually turned ON, since its gate is capacitively coupled through tunneling diode 322 to a positive potential of 3.5 V on floating gate 318. Therefore, the output of weak inverter, voltage $V_1$, is forced LOW, since NMOS transistors 306 and 316 are ON and PMOS transistor 304 is OFF, coupling $V_1$ to ground. When input voltage $V_1$ is LOW, the output of strong inverter 302, output voltage $V_2$ is HIGH, which corresponds to the previously configured state of the PLD latch.

If signal $V_1$ was previously HIGH, on the other hand, the EEPROM cell is programmed since charge was stored on floating gate 318, as outlined above. In that case, hold transistor 316 is not conducting, since a control gate voltage $V_{CG}$ of 5 V is insufficient to turn hold transistor 316 ON when the floating gate 318 is storing a charge. The voltage on the floating gate 318 after applying a control gate voltage of 5 V will be about −0.5 V, since the floating gate was at a potential of −4 V and a $V_{CG}$ of 5 V induced an increase in the floating gate potential of 3.5 V. The potential of −0.5 V on floating gate 318 is also input to PMOS transistor 304, which is sufficient to turn it ON, pulling $V_1$, the output of the weak inverter, HIGH. Therefore, the output of strong inverter 302, voltage $V_2$, is LOW, and the previous state of the latch has been restored by the programmed EEPROM cell.

Figure 4:
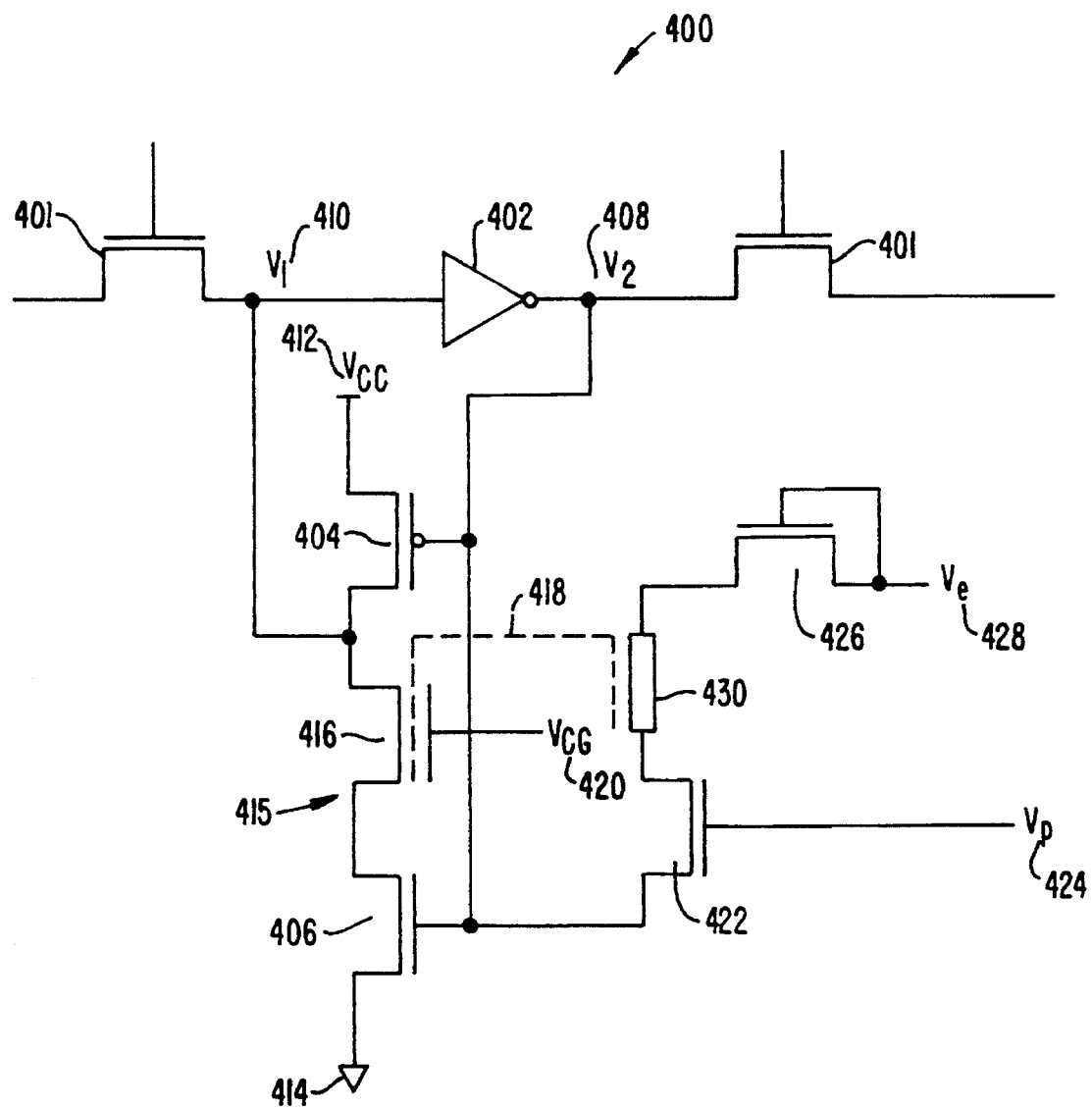
FIG. 4 is a schematic diagram of a representative configuration memory cell in a PLD where an EEPROM having electrically erasable capabilities is used to store configuration data.

FIG. 4 is a schematic diagram of a latch in a PLD where the hold memory cell is implemented by an EEPROM cell that includes the capability to be electrically erased. The embodiment of FIG. 4 thus is not as compact as that of FIG. 3 and will use additional die space on the PLD, but the additional feature allowing a user to electrically erase the hold memory cell of a PLD latch allows the same device to be used many times in a circuit design without replacing the PLD.

FIG. 4 shows a representative memory cell 400 in a PLD situated between pass transistors 401 that includes an SRAM cell and an EEPROM hold memory cell 415. The structure of the SRAM cell in memory cell 400 is similar to that of memory cell 300 (shown in FIG. 3). The SRAM cell includes a strong inverter 402 and a weak feedback inverter, which is the combination of PMOS transistor 404 and NMOS transistor 406. The output of strong inverter 402 is voltage $V_2$ 408 and is coupled to the gate of NMOS transistor 406, while the output of the weak inverter at the drain of PMOS transistor 404 is coupled to the input of strong inverter 402, which is voltage $V_1$ 410. The source of PMOS transistor 404 is pulled up to power supply potential $V_{cc}$ 412 and the source of NMOS transistor 406 is pulled down to ground potential 414.

The EEPROM hold memory cell 415 in the embodiment of FIG. 4, unlike that of FIG. 3, includes the additional transistors that facilitate electronic erasure of the memory cell. Therefore, this embodiment of the present invention would be useful for repeated use in the same circuit. Once the decision has been made to change the configuration of the PLD, the user could globally electrically erase the PLD and programmed the device again. EEPROM hold memory cell 415 includes hold transistor 416 with a floating gate 418. The EEPROM cell is controlled at its gate by a control gate voltage $V_{CG}$ 420, which a global control line. The drain of transistor 416 is coupled to the output of the weak inverter at the drain of PMOS transistor 404, while the source of hold transistor 416 is coupled to the drain of NMOS transistor 406.

An NMOS transistor 422 facilitates programming of the EEPROM cell. The source of programming transistor 422 is coupled to the gate of NMOS transistor 406 and the gate is coupled to a programming signal $V_p$ 424. Another NMOS transistor 426 facilitates erasure of the EEPROM cell. An erase signal $V_e$ 428 is coupled to both the source and gate of eraser transistor 426. A tunneling diode at diffusion node 430 couples the drain of programming transistor 422 to the drain of erase transistor 426. Floating gate 418 is also coupled to diffusion node 430. Both programming signal 424 and erase signal 428 are global signals which are input to all programming transistors and erase transistors throughout the PLD.

In operation, the EEPROM cell is erased at initial system power-up. System-wide erasure is achieve by setting erase signal $V_e$ to a very high potential, such as 14 V, and pulling programming signal $V_p$ and control gate voltage $V_{CG}$ to ground. Because $V_e$ is at such a high potential, the diffusion node 430 at the drain of erase transistor 426 is also at a high potential, about 12 V. This high potential at diffusion node 430 attracts electrons from the floating gate 418 and erases the EEPROM cell, according to Fowler-Nordheim principles of erasure of an EEPROM cell. The voltage on floating gate 418 after the erase process is about 2 V. Once the erase process is complete, $V_e$ and $V_p$ are returned to ground potential.

$V_{CG}$ is then set to 5 V, allowing the erased EEPROM hold transistor 416 to conduct and act as a simple resistor between the PMOS and NMOS transistors 404, 406 in the weak inverter. The user may then program the latches 400 to operate the PLD in a desired fashion in a logic circuit. When it comes time to power the system down, however, the states of the configured latches will need to be stored so that the PLD can again be used in the same system upon subsequent power-up without the user having to reprogram all of the latches. To initiate programming, control gate voltage $V_{CG}$ 420 is set to a very high potential, such as 14 V. Assuming a typical coupling ratio of 0.7 between the control gate and floating gate of an EEPROM device, the very high potential of 14 V at $V_{CG}$ 420 creates a potential of approximately 9.8 V on floating gate 418. Programming signal $V_p$ 424 is set to a high potential, such as 7 V, and erase signal $V_e$ 428 is pulled to ground. Because programming signal $V_p$ is set to 7 V, the programming transistor 422 is ON, passing the logic state of $V_2$ 408 to diffusion node 430.

If the configuration to be stored is such that the input of strong inverter 402, signal $V_1$ 410, is a logic level LOW, the signal $V_2$ 408, and the input to the gate of NMOS transistor 406, is a logic HIGH. Thus, the logic HIGH of $V_2$ is passed to diffusion node 430. Because the voltage level at diffusion node 430 is 5 V, there is an insufficient potential gradient between the voltage of about 9.8 V on floating gate 418 and the diffusion node 430 to inject electrons on the floating gate 418, according to Fowler-Nordheim principles of programming an EEPROM cell. Therefore, the floating gate 418 will not receive any charge and the EEPROM cell will remain erased. On the other hand, if the configuration of the PLD latch to be stored is such that $V_1$ 410 is HIGH, $V_2$ 408 will then be at a logic LOW, creating a large potential gradient across diffusion node 430 with respect to floating gate 418 that is sufficient to draw electrons on to the floating gate 418. This process leaves a negative potential of −2 V on the floating gate 418, signifying that EEPROM hold transistor 416 is in a programmed state. After the programming process is complete, the system power may be terminated and the logic state of each SRAM latch 400 is saved in its associated EEPROM memory cell.

Upon subsequent power-up of the system, the state of each latch 400 will be restored to its previous state by setting control gate voltage $V_{CG}$ 414, programming signal $V_p$ 424 and erase signal $V_e$ 428 to certain predetermined levels. Specifically, $V_{CG}$ is set to 0 V, and $V_p$ and $V_e$ are both set to 2 V. At these voltage levels, all three signals will "refresh" the PLD memory cells to their previously configured states.

If signal $V_1$ was previously LOW, the EEPROM cell was erased since no charge was stored on floating gate 418. In that case, hold transistor 416 of the EEPROM cell is conducting because the control gate voltage $V_{CG}$ is sufficient to turn it ON. By setting $V_p$ to 2 V, transistor 422 will conduct, forcing the drain to a slightly positive voltage of about 0.7 V. Since the drain of programming transistor 422 is coupled to the gate of NMOS transistor 406, this slightly positive voltage will turn NMOS transistor 406 ON, which in turn will tie the output of the weak inverter, voltage $V_1$ 410, to ground, because EEPROM hold transistor 416 is also conducting. When input voltage $V_1$ is LOW, the output of strong inverter 402, output voltage $V_2$ is HIGH, which corresponds to the previously configured state of the PLD latch.

If signal $V_1$ was previously HIGH, on the other hand, the EEPROM cell is programmed since charge was stored on floating gate 418, as outlined above. In that case, hold transistor 416 is not conducting, since a control gate voltage $V_{CG}$ of 0 V is insufficient to turn hold transistor 416 ON when the floating gate 418 is storing a charge. Because the EEPROM hold transistor 416 is OFF, the refresh signals are cut off and have no effect on the weak inverter. The output of the weak inverter, voltage $V_1$, is therefore coupled through PMOS transistor 404 to power supply potential $V_{cc}$ 412. This capacitive coupling tends to push $V_1$ to a positive potential. If the input voltage $V_1$ to strong inverter 402 is HIGH, the output of strong inverter 402, voltage $V_2$, is LOW, and the previous state of the latch has been restored by the programmed EEPROM cell.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. In a programmable logic device in a single integrated circuit package, a reconfigurable memory comprising:

an inverter having an input and an output;

a PMOS transistor having a gate coupled to the output of the inverter, a drain coupled to the input of the inverter and a source coupled to a power supply potential;

an NMOS transistor having a gate coupled to the output of the inverter, a source coupled to a ground potential and a drain;

an Erasable Programmable Read Only Memory (EPROM) coupling the PMOS transistor to the NMOS transistor; and a charge circuit for selectively programming the EPROM.

2. The reconfigurable memory of claim 1 wherein the EPROM further comprises:

a first transistor having a drain coupled to the drain of the PMOS transistor, a source coupled to the drain of the NMOS transistor, a control gate and a floating gate for holding a charge;

a second transistor having a control gate coupled to the control gate of the first transistor, a floating gate coupled to the floating gate of the first transistor, a source and a drain;

a third transistor having a gate coupled to the input of the inverter, a drain coupled to the source of the second transistor and a source coupled to the ground potential; and a capacitor coupling the control gates of the first and second transistors to the gate of the NMOS transistor.

3. The reconfigurable memory of claim 1 wherein the charge circuit further comprises:

a global control line coupled to the control gates of the first and second transistors; and a global programming line coupled to the drain of the third transistor;

wherein a first voltage applied to the global control line and a second voltage applied to the global programming line cause the EPROM to be programmed with the input of the inverter; and wherein, upon a restoration of power to the programmable logic device, the input of the inverter is reconfigured with the contents of the EPROM.

4. In a programmable logic device in a single integrated circuit package, a reconfigurable memory comprising:

an inverter having an input and an output;

a PMOS transistor having a gate coupled to the output of the inverter, a drain coupled to the input of the inverter and a source coupled to a power supply potential;

an NMOS transistor having a gate coupled to the output of the inverter, a source coupled to a ground potential and a drain;

an Electrically Erasable Programmable Read Only Memory (EEPROM) coupling the PMOS transistor to the NMOS transistor; and a charge circuit for selectively programming the EPROM with the input of the inverter.

5. The reconfigurable memory of claim 4 wherein the EEPROM further comprises:

a hold transistor having a drain coupled to the drain of the PMOS transistor, a source coupled to the drain of the NMOS transistor, a control gate and a floating gate for holding a charge; and a tunneling diode coupling the gate of the NMOS transistor to the floating gate of the hold transistor.

6. The reconfigurable memory of claim 4 wherein the charge circuit further comprises a global control line coupled to the control gate of the hold transistor, wherein a voltage applied to the global control line causes the EEPROM to be programmed with the input of the inverter, and wherein, upon restoration of power to the programmable logic device, the input of the inverter is reconfigured with the contents of the EEPROM.

7. The reconfigurable memory of claim 4 wherein the EEPROM further comprises:

a hold transistor having a drain coupled to the drain of the PMOS transistor, a source coupled to the drain of the NMOS transistor, a control gate and a floating gate for holding a charge;

a programming transistor having a source coupled to the gate of the NMOS transistor, a gate and a drain;

an erase transistor having a drain, a gate coupled to the drain of the erase transistor and a source; and a diffusion node coupling the source of the erase transistor to the floating gate of the hold transistor and to the drain of the programming transistor.

8. The reconfigurable memory of claim 4 wherein the charge circuit further comprises:

a global control line coupled to the control gate of the hold transistor;

a global programming line coupled to the gate of the programming transistor; and a global erase line coupled to the drain of the erase transistor;

wherein a first voltage applied to the global control line, a second voltage applied to the global programming line and a third voltage applied to the global erase line cause the EEPROM to be programmed with the input of the inverter; and wherein, upon restoration of power to the programmable logic device, the input of the inverter is reconfigured with the contents of the EEPROM.

9. A reconfigurable memory on a single die in an integrated circuit package comprising:

an inverter having an input and an output;

a PMOS transistor having a gate coupled to the output of the inverter, a drain coupled to the input of the inverter and a source coupled to a power supply potential;

an NMOS transistor having a gate coupled to the output of the inverter, a source coupled to a ground potential and a drain;

a hold transistor having a drain coupled to the drain of the PMOS transistor, a source coupled to the drain of the NMOS transistor and a gate; and a charge circuit coupled to the gate of the hold transistor.

10. The reconfigurable memory of claim 9 wherein a voltage applied to the charge circuit causes the hold transistor to be programmed with the input of the inverter, and wherein, upon restoration of power to the reconfigurable memory, the input of the inverter is reconfigured with the contents of the hold transistor.

11. The reconfigurable memory of claim 9 wherein the hold transistor comprises an Erasable Programmable Read Only Memory.

12. The reconfigurable memory of claim 9 wherein the hold transistor comprises an Electrically Erasable Programmable Read Only Memory.

* * * * *